United States Patent
Dhong et al.

(10) Patent No.: US 6,826,110 B2
(45) Date of Patent: Nov. 30, 2004

(54) CELL CIRCUIT FOR MULTIPORT MEMORY USING DECODER

(75) Inventors: Sang Hoo Dhong, Austin, TX (US); Harm Peter Hofstee, Austin, TX (US); Shoji Onishi, Austin, TX (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 245 days.

(21) Appl. No.: 10/273,567

(22) Filed: Oct. 17, 2002

(65) Prior Publication Data

US 2004/0076063 A1 Apr. 22, 2004

(51) Int. Cl.⁷ .................................. G11C 8/00
(52) U.S. Cl. ..................... 365/230.05; 365/189.02
(58) Field of Search ............... 365/230.05, 189.02, 365/189.04, 220

(56) References Cited

U.S. PATENT DOCUMENTS 5,657,291 A * 8/1997 Podlesny et al. ...... 365/230.05
6,166,963 A * 12/2000 Wen ....................... 365/189.04
6,212,122 B1 * 4/2001 Wen ....................... 365/230.05
6,594,194 B2 * 7/2003 Gold et al. ............. 365/230.03

* cited by examiner

Primary Examiner—Anh Phung
(74) Attorney, Agent, or Firm—Carr LLP; Robert M. Carwell

(57) ABSTRACT

An improved cell circuit for data readout with reduced number of read wordlines is provided in a memory block of a multiport memory array. The number of read wordlines is significantly reduced by using a decoder between the read wordlines and a multiplexer in the cell circuit. The memory block has a plurality of address inputs and stores a plurality of write data signals. In the cell circuit, the decoder receives as decoder inputs a subset of the address inputs and outputs a plurality of select signals. The multiplexer is coupled to the decoder to receive the select signals and select one of the write data signals based on the select signals. Additionally, the read wordlines are coupled to the decoder for carrying the subset of the address inputs to the decoder.

22 Claims, 5 Drawing Sheets

CELL CIRCUIT FOR MULTIPORT MEMORY USING DECODER

CROSS REFERENCE TO RELATED APPLICATIONS

The present invention is related to a U.S. patent application entitled "CELL CIRCUIT FOR MULTIPORT MEMORY USING 3-WAY MULTIPLEXER," Ser. No. 10/273,590, now U.S. Pat. No. 6,717,882, issued on Apr. 6, 2004, assigned to the same assignee, and incorporated herein by reference.

BACKGROUND OF THE INVENTION

1. Field of the Invention

The invention relates generally to a multiport memory and, more particularly, to an improved cell circuit for data readout for use in a multiport memory.

2. Description of the Related Art

Current microelectronic circuits will achieve complicated systems with a great number of transistors, and the number will keep increasing in the future. Generally, these systems include a plurality of cooperating subsystems for processing data. One apparent problem with realizing these systems is the storage of the data to be processed, as well as their data processing programs. The most powerful systems will surely be realizable if a memory is available to which the subsystems can gain access chronologically parallel and with a high bandwidth. Such memories, which have multiple ports as external terminals, to which the external component units can gain access chronologically parallel, are generally known as multiport memories.

A prior-art multiport memory generally uses a large multiplexer to select one of a plurality of data store cell outputs. This multiplexer requires the same number of select signals as that of the data store cell outputs. Typically, this translates into the same number of read wordlines each carrying a single select signal. For example, if a memory block requires an 8:1 multiplexer, eight select signals are required for controlling the multiplexer. In this example, a prior-art cell circuit would have eight read wordlines for carrying the eight select signals to the multiplexer from outside the memory array. Under this circuit design, the number of read wordlines-eight in this example-would require too much space, since adding each read wordline generally requires large space. Also, there are other concerns relating to having a large number of read wordlines such as power consumption in the memory array. These space and/or power concerns become more and more relevant and legitimate in designing a memory array, as the capacity of a memory dramatically increases.

Therefore, a need exists for a multiport memory with an improved readout cell configuration that takes up less space for a readout cell area by reducing both the readout cell area and the number of read wordlines.

SUMMARY OF THE INVENTION

The present invention provides a cell circuit for data readout in a memory block of a multiport memory array. The memory block has a plurality of address inputs and stores a plurality of write data signals. In the cell circuit, a decoder receives as decoder inputs a subset of the address inputs and outputs a plurality of select signals.

In one aspect of the invention, a multiplexer is coupled to the decoder. The multiplexer receives the select signals and selects one of the write data signals based on the select signals.

In another aspect, a plurality of read wordlines is coupled to the decoder for carrying the subset of the address inputs to the decoder.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, it will be obvious to those skilled in the art that the present invention may be practiced without such specific details. In other instances, well-known elements have been illustrated in schematic or block diagram form in order not to obscure the present invention in unnecessary detail.

Figure 1:
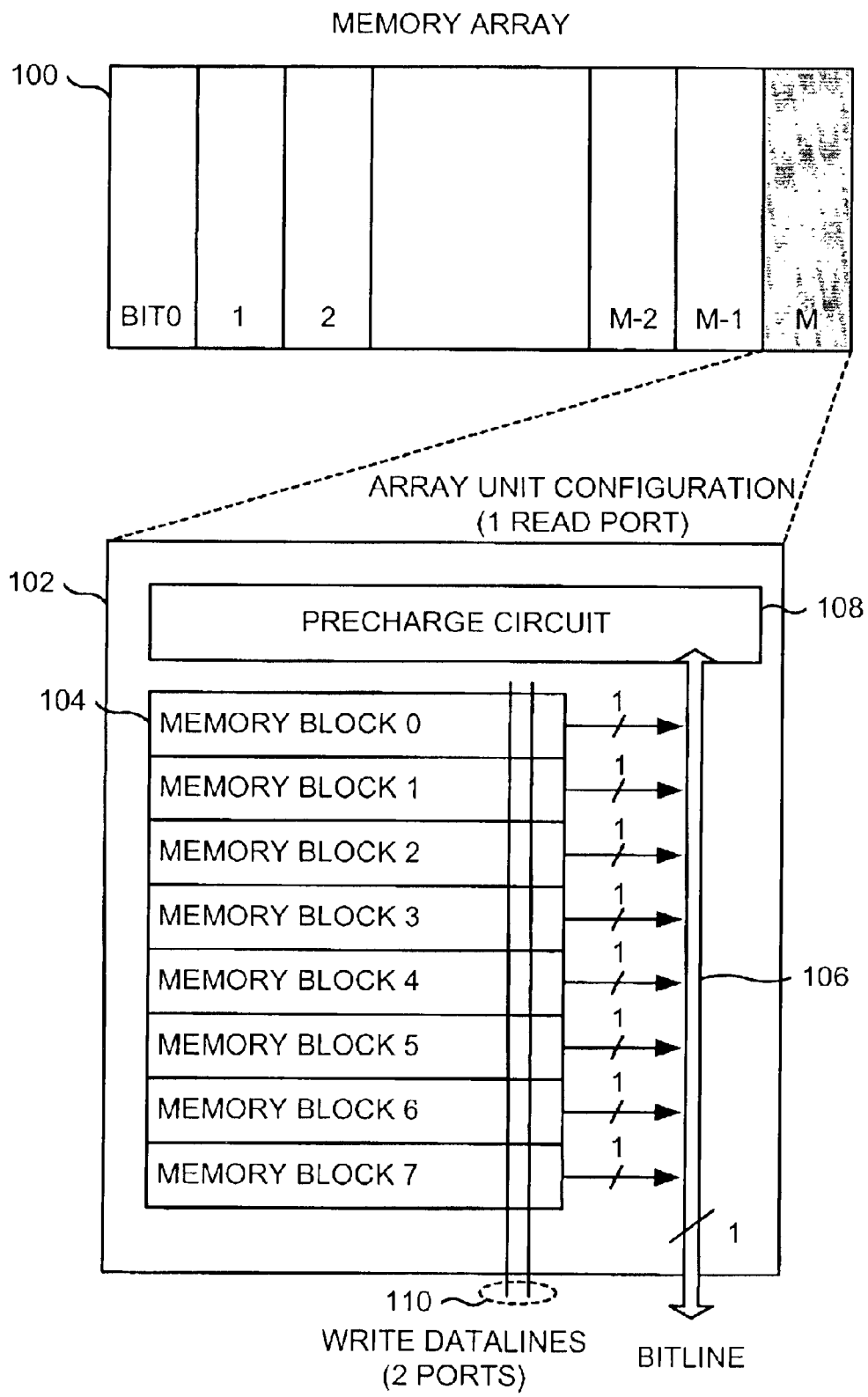
FIG. 1 depicts a multiport memory array structure in a block diagram.

Referring to FIG. 1 of the drawings, the reference numeral 100 generally designates a block diagram of a memory array having M+1 array units for bits 0 through M, wherein M is an integer larger than 0. In this figure, the memory array 100 is shown as an example to illustrate a 64 entry×M-bit array having two write ports and one read port.

An array unit 102 for bit M is shown in further detail. The array unit 102 generally comprises a plurality of memory blocks 0–7 (hereinafter collectively referred to as "memory blocks 104") coupled to a bitline 106. Alternatively, a plurality of bitlines may be used for a plurality of read ports. Each of the memory blocks 104 is coupled to the memory blocks 104. Preferably, the bitline 106 carries a dynamic ORed signal; therefore, a precharge circuit 108 is used in the array unit 102.

Figure 2:
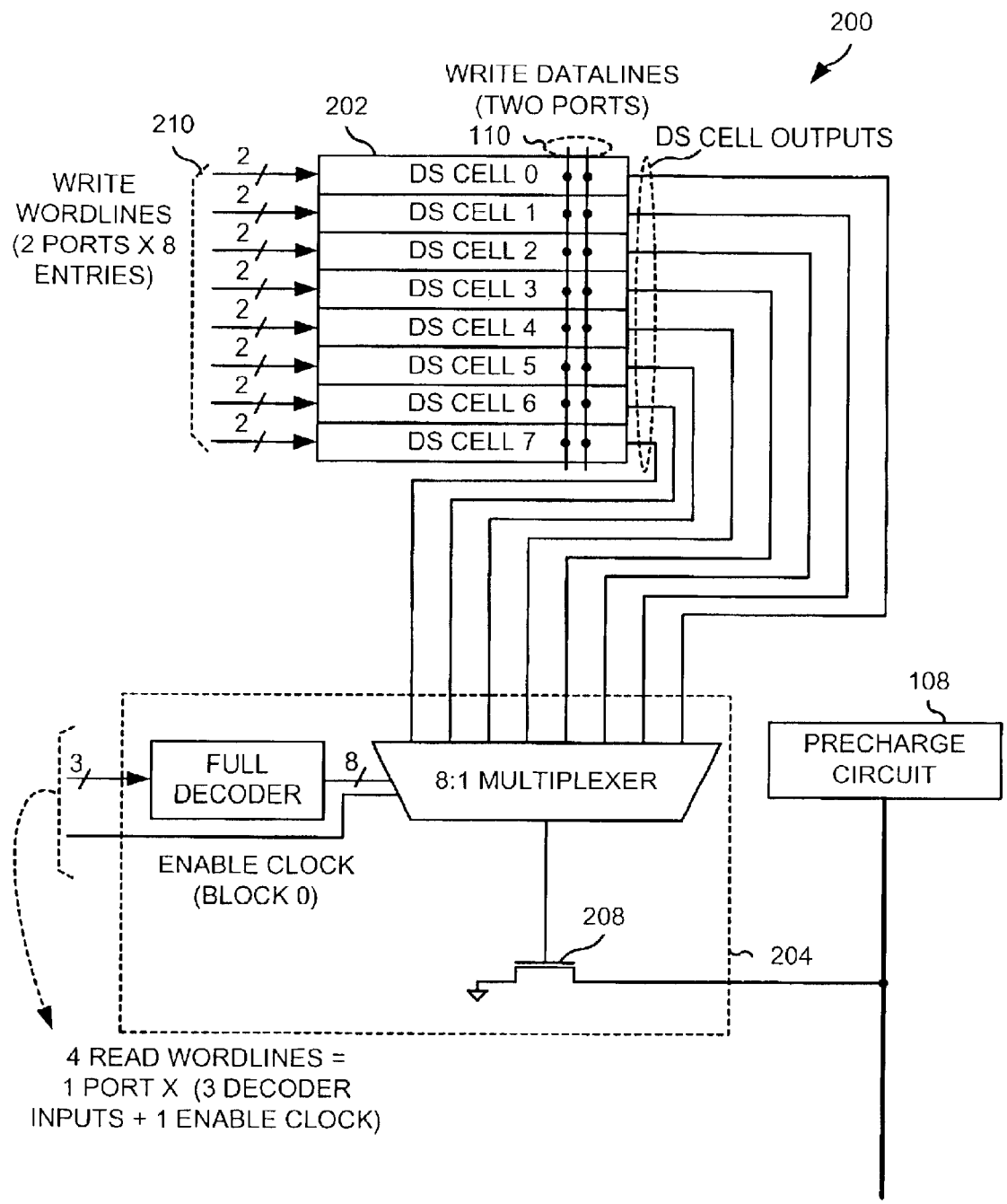
FIG. 2 is a schematic diagram of a memory block as shown in FIG. 1.

A more detailed illustration of these connections is shown in FIG. 2. Two write datalines 110 are coupled to each of the memory blocks 104 to provide two write data inputs (not shown) to each of the memory blocks 104. Each memory block also receives write wordlines (not shown) to select one of the two write data inputs.

Now referring to FIG. 2, a schematic diagram of a memory block 200 is depicted to illustrate one of the memory blocks 104 of FIG. 1 in general and the memory block 0 of FIG. 1 in particular. The memory block 200 generally comprises a plurality of data store (DS) cells 0–7 (hereinafter collectively referred to as "DS cells 202"). Each of the DS cells 202 receives two write datalines 110 and two write wordlines. The two write wordlines in each of the DS cells 202 are used to select as a DS cell output one of the two write datalines 110. If neither of the two write datalines 110 is selected in a DS cell, then a previous state of the DS cell is selected. Since each of the DS cells 202 outputs a DS cell output, the DS cells 202 output eight DS cell outputs. More details on the DS cells are described further below in reference to FIG. 3. Note however that there are eight DS cells in this example, resulting in eight DS cell outputs.

The DS cells 202 are coupled to a readout cell 204. Generally, if there are N read ports, wherein N is an integer larger than zero, there will be N number of readout cells.

The readout cell 204 has a full decoder 205, an 8:1 multiplexer 206, and a discharge device 208. The output of the readout cell 204 is coupled to the bitline 106. The full decoder 205 receives three decoder inputs 205A and generates eight decoder outputs 205B. The 8:1 multiplexer 206 is coupled to the DS cells 202 to receive eight DS cell outputs and also coupled to the full decoder 205 to receive as control signals the eight decoder outputs 205B. Additionally, the 8:1 multiplexer 206 receives an enable clock signal for the memory block 0. The 8:1 multiplexer 206 outputs a control signal, which is input to the discharge device 208.

Figure 5:
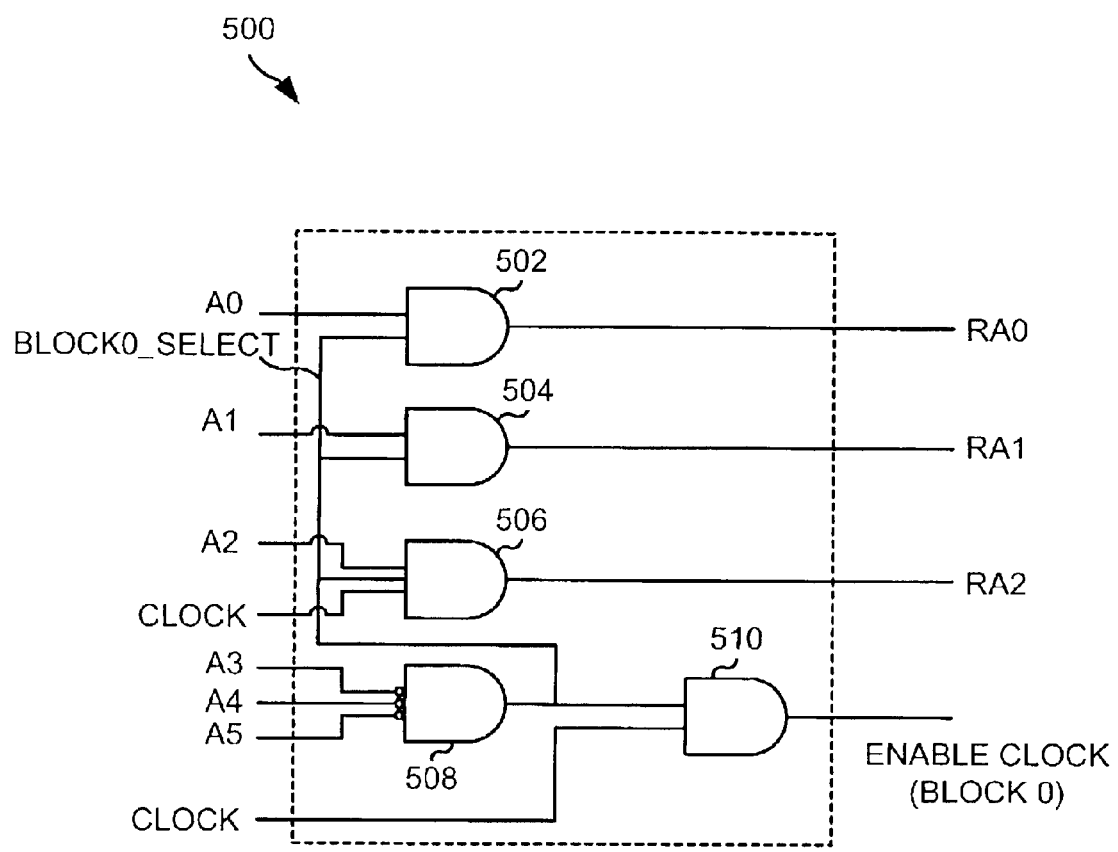
FIG. 5 is a schematic diagram of a partial decoder outside a multiport memory array as shown in FIG. 1.

Preferably, the decoder inputs 205A comprise three least significant bits (LSBs) A0, A1, and A2 of six address inputs A0, A1, A2, A3, and A5 shown in FIG. 5, for the 64-entry memory array 100 ($64=2^6$) when the memory block 200 is selected. When the memory block 200 is not selected, the decoder inputs 205A will be disabled, thereby turning off the discharge device 208 regardless of the three LSBs of six address inputs A0, A1, A2, A3, A4, and A5.

The decoder inputs 205A are received from a partial decoder shown in FIG. 5, outside the memory array 100 to implement this configuration. In the following discussion in reference to FIG. 2, it is assumed, unless mentioned otherwise, that the memory block 200 is selected, and thus that the decoder inputs 205A comprise three LSBs of the six address inputs A0, A1, A2, A3, A4, and A5. Note in this preferred embodiment that the enable clock signal for the memory block 0 is coupled to each of the 2:1 multiplexers 402, 404, 406, and 408.

Generally, there are N address inputs for a $2^N$-entry memory array. Thus, in a multiport memory having $2^L$ DS cells (L=3 in this example), for a $2^N$-entry memory array, the decoder inputs will comprise L (L=3 in this example) LSBs of N address inputs, wherein L is a positive integer and N is an integer larger than two (2). For N=1 and 2, the decoder inputs comprises entire N address inputs. In this general case, remaining (N–L) most significant bits (MSBs) of the six address inputs are used to generate the enable clock signal to control one of $2^{(N-L)}$ memory blocks, wherein N is an integer larger than two. For N=1 and 2, no enable clock signal is necessary, because there is only one memory block in the array unit 102 of FIG. 1.

Four read wordlines per memory block are provided for this one read port configuration, compared to eight read wordlines per memory block in a prior-art one read port configuration. Generally, there will be only (L+1)*N read wordlines per memory block for a memory array having N read ports and L DS cells per memory block, wherein L and N are an integer larger than zero. For example, a memory array having six read ports and will have only 4*6 or 24 read wordlines per memory block compared to 8*6 or 48 read wordlines per memory block that would be required in a prior-art memory array.

The discharge device 208 is coupled to the precharge circuit 108 via the bitline 106. Preferably, the output signal of the 8:1 multiplexer 206 is a dynamic signal to enable the discharge device 208. Since there are seven other memory blocks 1–7 each with an 8:1 multiplexer (not shown), the bitline 106 is couple to eight multiplexers, thereby carrying a dynamic ORed signal of eight output signals of the eight multiplexers.

Figure 3:
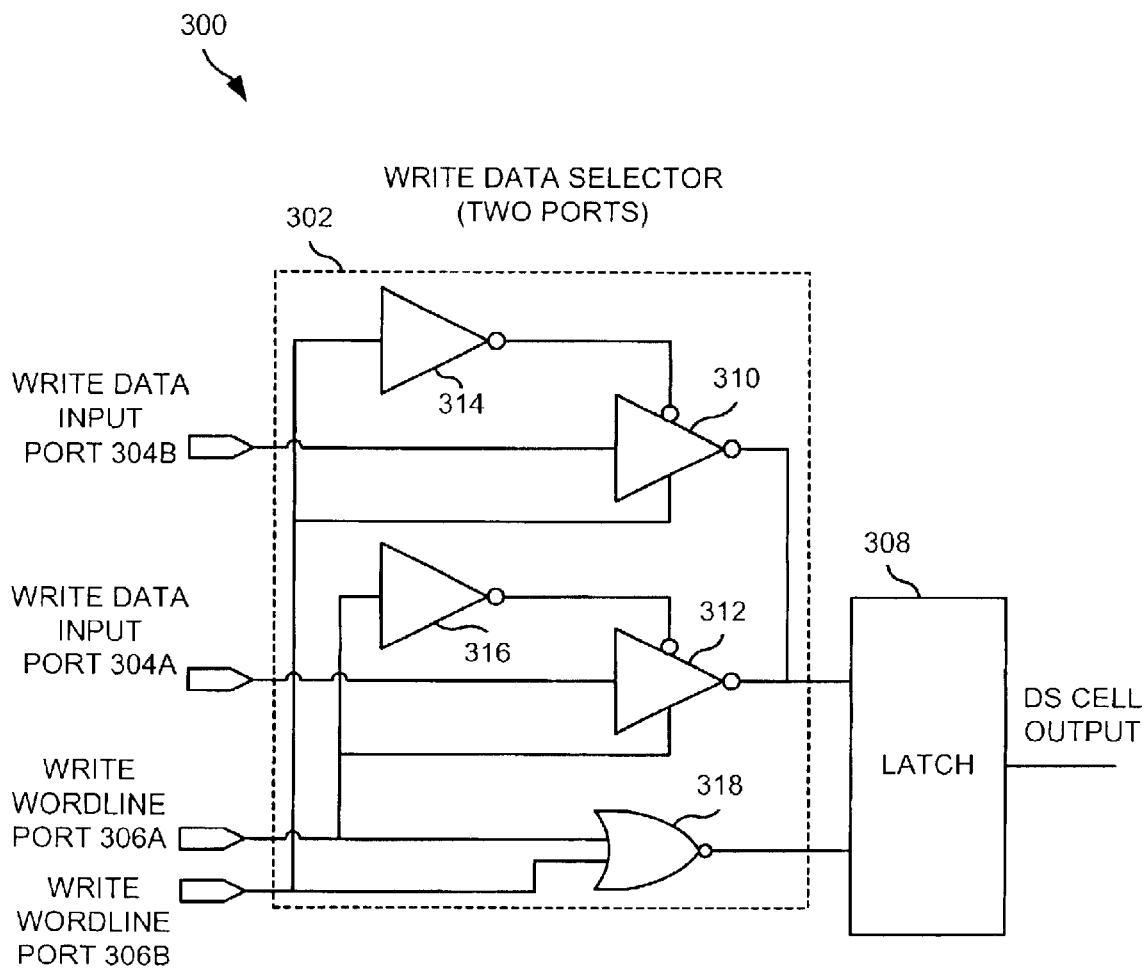
FIG. 3 is a schematic diagram illustrating a preferred embodiment of a data store cell circuit as shown in FIG. 2.

FIG. 3 depicts a schematic diagram of a data store (DS) cell circuit 300. Preferably, the DS cell circuit 300 represents any of the DS cells 202 of FIG. 2. The DS cell circuit 300 comprises a write data selector 302 having two write data input ports 304A and 304B for receiving first and second write data inputs in accordance with the examples having two write data inputs as shown in FIGS. 1 and 2. The write data selector 302 also includes two write wordline ports 306A and 306B for receiving first and second write wordlines, respectively, and selecting one of the two write data inputs or neither of them based on the first and second write wordlines.

The write data selector 302 is coupled to a latch 308, which outputs a DS cell output signal. The DS cell output signal is either updated with one of the two write data inputs or keeps a previous data (e.g., one of the two write data inputs in a previous clock cycle). The write data selector 304 generally comprises first and second three-state inventors 310 and 312 respectively coupled to the write data input port 304B and write data input port 304A.

The first three-state inverter 310 is coupled to a first inverter 314 for receiving as an enable signal an inverted signal of the output of the inverter 314. The first three-state inverter 310 is also coupled to the write wordline port 306B to receive as a complementary enable signal the second write wordline. Similarly, the three-state inverter 312 is coupled to a second inverter 316 for receiving as an enable signal an inverted signal of the output of the second inverter 316. The second three-state inverter 312 is also coupled to the write wordline port 306A to receive as a complementary enable signal the first write wordline. The write data selector 302 also includes a NOR gate 318 for determining whether the latch 308 should be updated with a new input or keep its current state.

Accordingly, the operation of the DS cell circuit 300 is as follows. When only the first write wordline is asserted, the write data selector 302 outputs only the first write data input through the second three-state inverter 312. This is because the first three-state inverter 310 is not enabled. In this case, the output of the NOR gate 318 is not asserted, resulting in an update of the DS cell output signal with the first write data input.

Similarly, when only the second write wordline is asserted, the write data selector 302 outputs only the second write data input through the first three-state inverter 310. This is because the second three-state inverter 312 is not enabled. In this case, the output of the NOR gate 318 is not asserted, resulting in an update of the DS cell output signal with the second write data input.

When both the first and second write wordlines are disabled, the NOR gate 318 disables the latch 308 and the DS cell output signal keeps its previous data.

Figure 4:
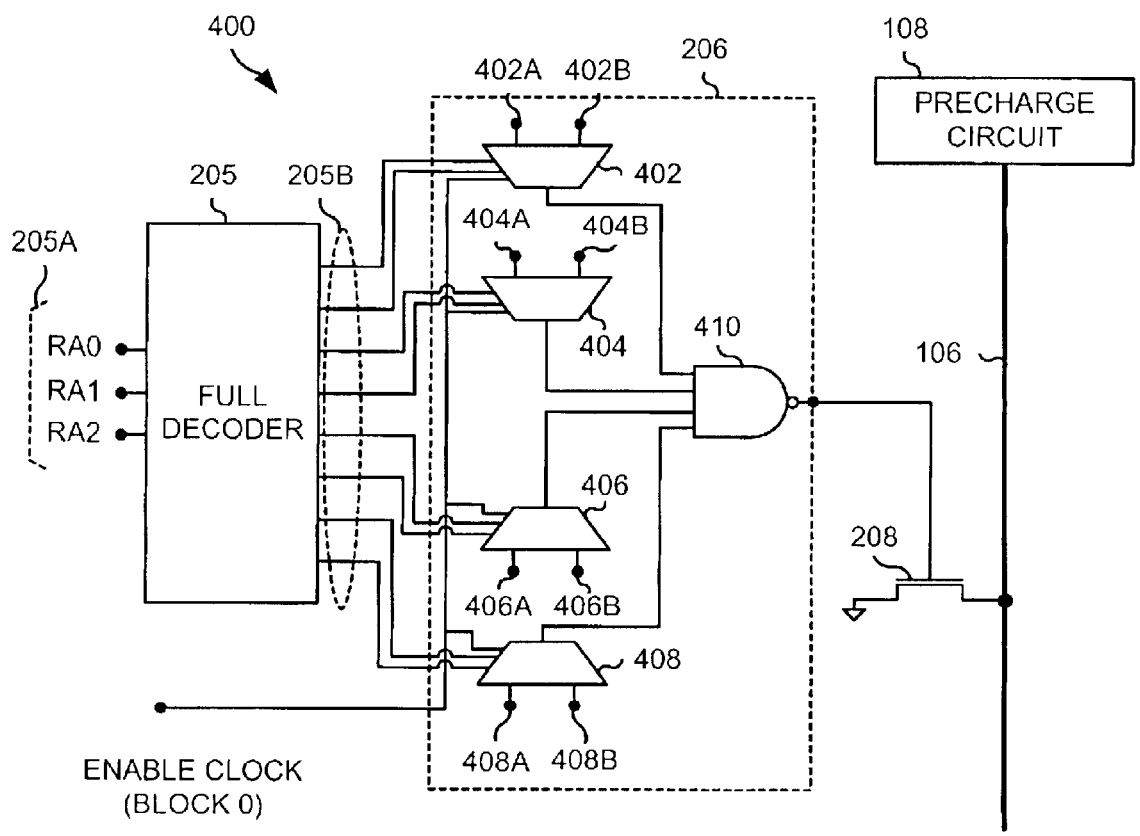
FIG. 4 is a schematic diagram of a readout cell circuit as shown in FIG. 2.

FIG. 4 shows a schematic diagram of a readout cell circuit 400. Preferably, the readout cell circuit 400 represents the readout cell 204 of FIG. 2. The readout cell circuit 400 comprises the full decoder 205, the 8:1 multiplexer 206, and the discharge device 208 as shown in FIG. 2. The full decoder receives the decoder inputs RA0, RA1, and RA2 (equivalent to the decoder inputs 205A of FIG. 2). The full decoder 205 is configured to generate the decoder outputs 205B from the three decoder inputs.

Preferably, the 8:1 multiplexer 206 comprises four 2:1 multiplexers 402, 404, 406, and 408 coupled to a NAND gate 410. The 2:1 multiplexer 402 has two input ports 402A and 402B. The 2:1 multiplexer 404 has two input ports 404A and 404B. The 2:1 multiplexer 406 has two input ports 406A and 406B. Similarly, the 2:1 multiplexer 408 has two input ports 408A and 408B. The input ports 402A, 402B, 404A, 404B, 406A, 406B, 408A, and 408B constitute the eight input ports of the 8:1 multiplexer 206. Accordingly, each of these input ports receives each of the eight DS cell outputs shown in FIG. 2. The full decoder 205 is not described herein, because it is well known in the art. Basically, for each combination of the decoder inputs RA0, RA1, and RA2, one of the eight decoder outputs 205B is selected. This in turn selects and outputs one of the eight DS cell outputs to control the discharge device 208.

In addition to the readout cell circuit 400, the precharge circuit 108 is also shown in FIG. 4 to be coupled to the discharge device 208 via the bitline 106.

Now referring to FIG. 5, a partial decoder circuit 500 is shown to illustrate the decoder inputs RA0, RA1, and RA2 and their relationship with input addresses A0, A1, A2, A3, A4, and A5. Note that the partial decoder circuit 500 resides outside the memory array 100 of FIG. 1 and is coupled to the full decoder 205 of FIG. 4 for providing the decoder inputs RA0, RA1, and RA2. The partial decoder 500 is also coupled to the 8:1 multiplexer 206 of FIG. 4 for providing the enable clock signal for selecting the memory block 0. Generally, for each of the memory blocks 0–7 of FIG. 1, there is a partial decoder outside the memory array 100 for providing these four signals to each of the memory blocks 0–7. The partial decoder 500 comprises five AND gates 502, 504, 506, 508, and 510.

The AND gate 502 receives the address input A0 (LSB) and a block0_select signal and outputs the decoder input RA0. The block0_select signal is obtained from the output of the AND gate 508 and is asserted to select the memory block 0 and deasserted otherwise. Therefore, the decoder input RA0 is the same as the address input A0 when the memory block 0 is selected. Otherwise, the decoder input RA0 is low regardless of the value of the address input A0. Similarly, the AND gate 502 receives the address input A1 and the block0_select signal and outputs the decoder input RA1. Therefore, the decoder input RA1 is the same as the address input A1 when the memory block 0 is selected. Otherwise, the decoder input RA1 is low regardless of the value of the address input A1.

The AND gate 506 receives the address input A2, the block0_select signal, and a clock signal. The only difference here is the additional of the clock signal as another input, thereby rendering the decoder input RA2 a dynamic signal. Preferably, the clock signal is a version of a reference clock signal of the memory array 100.

The AND gate 508 receives inverted versions of the address inputs A3, A4, and A5 and outputs the block0_select signal. The AND gate 510 is coupled to the AND gate 508 to render the enable clock signal a dynamic signal. Accordingly, the enable clock signal will be the same as the clock signal when all the address inputs A3, A4, and A5 are deasserted. Otherwise, the enable clock signal will be low regardless of the clock signal. It is noted that the decoder inputs RA0 and RA1 are static signals, whereas the decoder input RA2 is a dynamic signal.

It will be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. A cell circuit for data readout in a memory block of a multiport memory array, the memory block having a plurality of address inputs and storing a plurality of write data signals, the cell circuit comprising:
   a first decoder receiving as first decoder inputs a subset of the address inputs and outputting a plurality of select signals;
   a multiplexer coupled to the first decoder for receiving the select signals and selecting one of the write data signals based on the select signals; and
   a plurality of read wordlines coupled to the first decoder for carrying the subset of the address inputs to the first decoder.

2. The cell circuit of claim 1, wherein the read wordlines is coupled to the multiplexer for carrying an enable clock signal to the multiplexer to dynamically enable the multiplexer, thereby dynamically enabling the memory block.

3. The cell circuit of claim 2, wherein the one of the write data signals is used to dynamically control a bitline of the multiport memory.

4. The cell circuit of claim 1, further comprising:
   a discharge device coupled to the multiplexer for receiving the one of the write data signals to generate a drive signal for driving a bitline of the multiport memory.

5. The cell circuit of claim 2, wherein the read wordlines are coupled to a second decoder residing outside the memory array for carrying the first decoder inputs and the enable clock signal from the second decoder to the first decoder and the multiplexer, respectively.

6. The cell circuit of claim 5, wherein the second decoder is a partial decoder.

7. The cell circuit of claim 5, wherein the second decoder is configured to receive the address inputs and output the subset of the address inputs and the enable clock signal.

8. The cell circuit of claim 7, wherein the second decoder further receives a block-selecting signal for selecting the memory block and a reference clock signal of the multiport memory.

9. The cell circuit of claim 8, wherein L number of address inputs are selected for the subset of the address inputs among a total of N number of the address inputs when there are $2^L$ number of the write data signals in the memory block, wherein N and L are positive integers.

10. The cell circuit of claim 8, wherein the enable clock signal is virtually the same as the reference clock when all address inputs other than the subset of the address inputs are asserted.

11. The cell circuit of claim 9, wherein there are a total of (L+1) number of the read wordlines in the memory block.

12. The cell circuit of claim 9, wherein the subset of the address inputs are L least significant bits (LSBs) of the address inputs.

13. The cell circuit of claim 9, wherein the multiplexer has $2^L$ inputs.

14. The cell circuit of claim 4, wherein the discharge device comprises a metal-oxide-silicon (MOS) transistor having a gate, drain, and source terminal.

15. The cell circuit of claim 4, wherein the gate terminal of the MOS transistor is coupled to the multiplexer for receiving the output enable signal.

16. The cell circuit of claim 1, wherein the multiport memory comprises a plurality of data store cells for storing the plurality of write data signals.

17. The cell circuit of claim 16, wherein the multiplexer is coupled to the data store cells for receiving the write data signals.

18. The cell circuit of claim 16, wherein there are $2^L$ number of the data store cells in the memory block.

19. The cell circuit of claim 16, wherein at least one of the data store cells comprises:

a write data selector for receiving a plurality of write data input signals and a plurality of write wordlines and selecting one of the write data input signals based on the write wordlines; and a latch for receiving the write wordlines and coupled to the write data selector.

20. The cell circuit of claim 16, wherein each write wordline enables a particular write data input signal to the latch, and wherein the latch keeps a previous output when all of the write wordlines are disabled.

21. A cell circuit for data readout in a memory block of a multiport memory array, the memory block having a plurality of address inputs and storing a plurality of write data signals, the cell circuit comprising:

means for receiving a subset of the address inputs and outputting a plurality of select signals;

means for receiving the select signals and selecting one of the write data signals based on the select signals; and means for carrying the subset of the address inputs to the memory block.

22. A method for reading data out of a memory block of a multiport memory array, the memory block having a plurality of address inputs and storing a plurality of write data signals, the method comprising the steps of:

receiving a subset of the address inputs and outputting a plurality of select signals;

receiving the select signals and selecting one of the write data signals based on the select signals; and carrying the subset of the address inputs to the memory block through a reduced number of read wordlines.

* * * * *